US007948285B2

United States Patent
Tsuda (10) Patent No.: US 7,948,285 B2
(45) Date of Patent: May 24, 2011

(54) PLL CIRCUIT, RADIO TERMINAL DEVICE AND CONTROL METHOD OF PLL CIRCUIT

(75) Inventor: Shinichiro Tsuda, Kanagawa (JP)

(73) Assignee: Sony Corporation, Toyko (JP)

( * ) Notice: Subject to any disclaimer, the term of this patent is extended or adjusted under 35 U.S.C. 154(b) by 0 days.

(21) Appl. No.: 12/496,065

(22) Filed: Jul. 1, 2009

(65) Prior Publication Data
US 2010/0019812 A1 Jan. 28, 2010

(30) Foreign Application Priority Data
Jul. 24, 2008 (JP) ................................. 2008-191491

(51) Int. Cl.
*H03L 7/06* (2006.01)
(52) U.S. Cl. ....................................... 327/156; 327/147
(58) Field of Classification Search .................. 327/147, 327/156
See application file for complete search history.

(56) References Cited

U.S. PATENT DOCUMENTS

| 5,511,100 | A  | * | 4/1996  | Lundberg et al. ............ 375/376 |
| 7,288,998 | B2 | * | 10/2007 | Thomsen et al. ............. 331/16 |
| 7,295,077 | B2 | * | 11/2007 | Thomsen et al. ............. 331/10 |
| 7,482,883 | B2 | * | 1/2009  | Staszewski et al. ........... 331/23 |
| 7,498,890 | B2 | * | 3/2009  | Wallberg et al. ............. 331/17 |
| 7,555,073 | B2 | * | 6/2009  | Jeong ........................... 375/344 |
| 7,570,182 | B2 | * | 8/2009  | Sheba et al. .................. 341/118 |
| 7,714,665 | B2 | * | 5/2010  | Waheed et al. ............... 331/16 |
| 7,724,048 | B2 | * | 5/2010  | Lesso ........................... 327/156 |
| 7,742,556 | B1 | * | 6/2010  | Qian et al. .................... 376/376 |
| 7,746,185 | B2 | * | 6/2010  | Staszewski et al. ........ 331/177 V |
| 7,756,487 | B2 | * | 7/2010  | Lerner et al. .................. 455/76 |
| 7,760,042 | B2 | * | 7/2010  | Mayer et al. .................. 332/128 |
| 7,778,610 | B2 | * | 8/2010  | Staszewski et al. ............ 455/76 |
| 2002/0097081 | A1 | * | 7/2002  | Razavi et al. ................. 327/307 |

(Continued)

FOREIGN PATENT DOCUMENTS

JP 9-200044 7/1997

(Continued)

OTHER PUBLICATIONS

Robert Bogdan Staszewski, et al., "All-Digital Phase-Domain TX Frequency Synthesizer for Bluetooth Radios in 0.13μm CMOS", ISSCC, International Solid State Circuits Conference, 2004, 10 pages.

*Primary Examiner* — Lincoln Donovan
*Assistant Examiner* — Adam D Houston
(74) *Attorney, Agent, or Firm* — Oblon, Spivak, McClelland, Maier & Neustadt, L.L.P.

(57) ABSTRACT

There is provided a PLL circuit including a phase comparison unit that compares an accumulated addition value of a division ratio converted into a digital value and that of an oscillating signal from an oscillator controlled by using the digital value in each cycle of a reference frequency, a data conversion unit that has a variable gain amplification unit to change a gain and causes output of the phase comparison unit to converge to an arbitrary setting value, an offset detection unit that detects an offset arising due to a change in gain of the variable gain amplification unit using output of the phase comparison unit, and an offset compensation unit that compensates for the offset detected by the offset detection unit in timing when the gain of the variable gain amplification unit changes.

4 Claims, 9 Drawing Sheets

U.S. PATENT DOCUMENTS

| | | | |
|---|---|---|---|
| 2006/0033582 A1* | 2/2006 | Staszewski et al. | 331/16 |
| 2006/0119402 A1* | 6/2006 | Thomsen et al. | 327/105 |
| 2006/0119437 A1* | 6/2006 | Thomsen et al. | 331/10 |
| 2007/0176691 A1* | 8/2007 | Batchelor et al. | 331/16 |
| 2008/0079501 A1* | 4/2008 | Hulfachor et al. | 331/16 |
| 2009/0322439 A1* | 12/2009 | Mayer et al. | 332/118 |
| 2010/0141316 A1* | 6/2010 | Weltin-Wu et al. | 327/159 |
| 2010/0188148 A1* | 7/2010 | Mehta et al. | 330/149 |

FOREIGN PATENT DOCUMENTS

| | | |
|---|---|---|
| JP | 2002-76886 | 3/2002 |
| JP | 2002-204160 | 7/2002 |

* cited by examiner

PLL CIRCUIT, RADIO TERMINAL DEVICE AND CONTROL METHOD OF PLL CIRCUIT

BACKGROUND OF THE INVENTION

1. Field of the Invention

The present invention relates to a PLL circuit, a radio terminal device, and a control method of the PLL circuit, and in particular, relates to a PLL circuit that compensates for an offset that arises when a loop gain is switched, a radio terminal device, and a control method of the PLL circuit.

2. Description of the Related Art

A PLL (Phase Locked Loop) circuit is used in a radio communication terminal to lock a carrier frequency to a correct frequency. In recent years, with increasingly finer semiconductor processes, a configuration in which a voltage controlled oscillator (VCO) controlled by an analog voltage is replaced by a digital controlled oscillator (DCO) is increasingly receiving attention.

In a PLL circuit using a VCO in related art, a phase difference between a reference clock and a clock obtained by dividing VCO output is compared using a phase comparator. Here, a circuit that converts a phase difference into pulse widths of three states of up, down, and up+down is used as a general phase comparator and a VCO is controlled by controlling a current source of a charge pump circuit using the pulses and converting the output current into a voltage by a loop filter.

Figure 5:
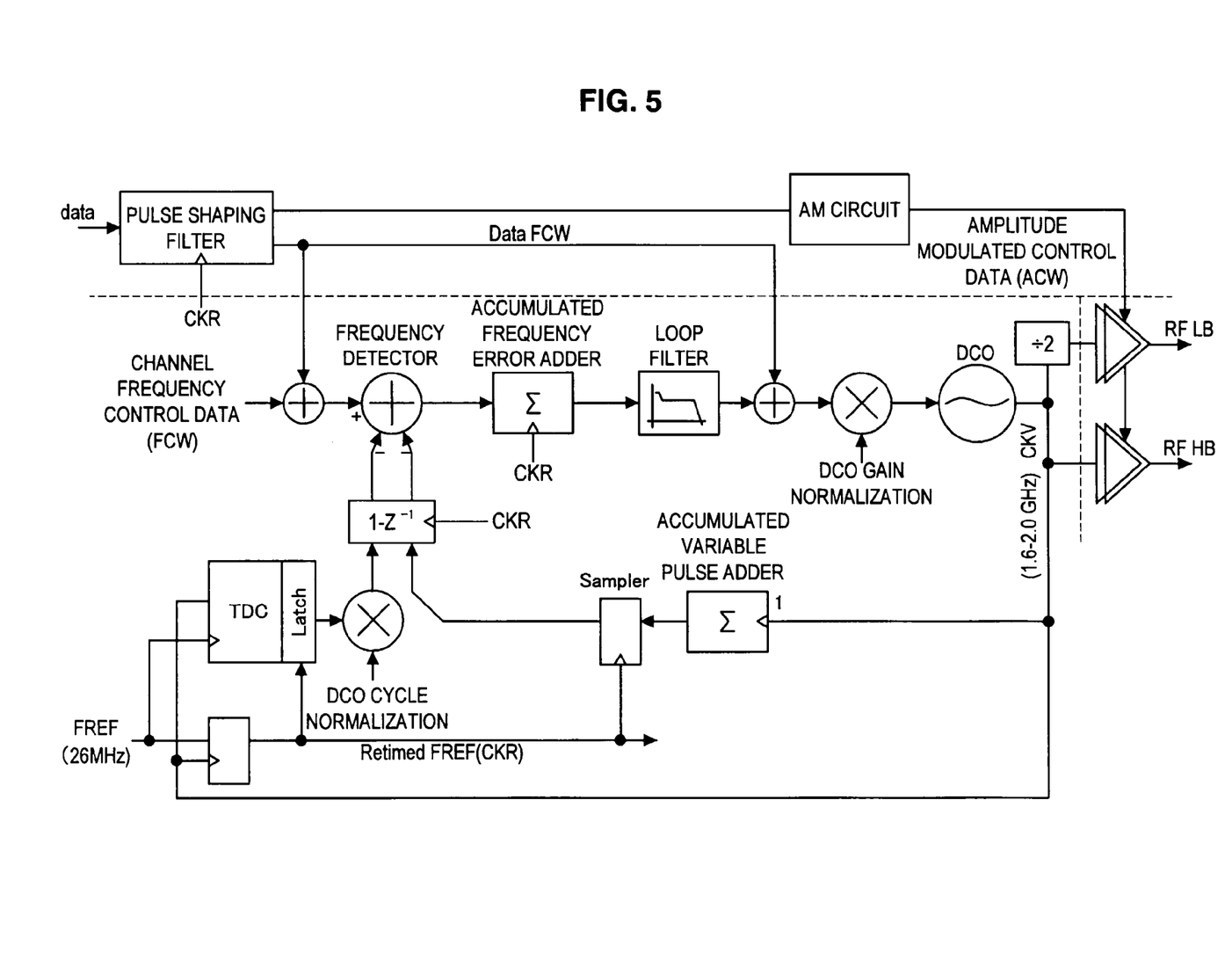
FIG. 5 is an explanatory view exemplifying an ADPLL circuit using a DCO in related art.

On the other hand, as an example of an ADPLL (All-Digital PLL) circuit using a DCO that is receiving attention in recent years, as shown in FIG. 5 (cited from R. B. Staszewski et al., "All-Digital Phase-Domain TX Frequency Synthesizer for Bluetooth Radios in 0.13 um CMOS, ISSCC2004 Digest"), the DCO is digitally controlled by converting a Fractional component of a time difference corresponding to a phase difference into a digital value by a Time-to-Digital Converter (TDC) circuit and an Integer component into a digital value by an accumulator circuit and giving feedback of these detected digital values corresponding to the phase difference by various methods.

SUMMARY OF THE INVENTION

There are mutually contradictory requirements for a PLL circuit to improve a time (lockup time) before an output frequency stabilizes and at the same time to reduce phase noise. In a system like a PLL circuit in which negative feedback is used, the time before an output frequency stabilizes, that is, the time necessary for convergence can be improved by broadening the loop band. However, there arises an issue that if the loop band is broadened, it is difficult to attenuate noise in the vicinity. Thus, in order to satisfy such requirements in a PLL circuit, a method of switching the loop gain in such a way that a convergence occurs with precision within a requested time is generally used.

However, if the method of switching the loop gain is executed in a PLL circuit, an offset arises when the loop gain is switched. Therefore, there is an issue that the lockup time of the PLL circuit becomes longer due to an offset that arises when the loop gain is switched.

Thus, the present invention has been made in view of the above issue and it is desirable to provide a novel and improved PLL circuit having a digitally controlled oscillator and capable of locking the frequency at high speed by compensating for an offset that arises when the loop gain is switched, a radio terminal device, and a control method of the PLL circuit.

According to an embodiment of the present invention, there is provided a PLL circuit, including: a phase comparison unit that compares an accumulated addition value of a division ratio converted into a digital value and that of a clock count of an oscillating signal from an oscillator controlled by using the digital value in each cycle of a reference frequency; a data conversion unit that has a variable gain amplification unit to change a gain and causes output of the phase comparison unit to converge to an arbitrary setting value; an offset detection unit that detects an offset arising due to a change in gain of the variable gain amplification unit using output of the phase comparison unit; and an offset compensation unit that compensates for the offset detected by the offset detection unit in timing when the gain of the variable gain amplification unit changes.

According to the above configuration, the phase comparison unit compares the phase by comparing an accumulated addition value of a division ratio converted into a digital value and that of a clock count of an oscillating signal from an oscillator controlled by using the digital value in each cycle of a reference frequency and the variable gain amplification unit changes a loop gain of a PLL circuit. Then, the data conversion unit causes output of the phase comparison unit to converge to an arbitrary setting value, the offset detection unit detects an offset arising due to a change in gain of the variable gain amplification unit using output of the phase comparison unit, and the offset compensation unit compensates for the offset detected by the offset detection unit in timing when the gain of the variable gain amplification unit changes. As a result, in a PLL circuit having a digitally controlled oscillator, the frequency can be locked at high speed by detecting an offset that arises when the loop gain is switched and compensating for the detected offset.

The offset detection unit may detect the offset by subtracting the arbitrary setting value from the output of the phase comparison unit.

The data conversion unit may include: a first variable gain amplification unit that amplifies the output of the phase comparison unit; an addition unit that adds the division ratio to the output of the first variable gain amplification unit; a second variable gain amplification unit that has the same gain as that of the first variable gain amplification unit and amplifies the setting value; a subtraction unit that subtracts the output of the second variable gain amplification unit from that of the addition unit; and a multiplication unit that multiplies the output of the subtraction unit by a value obtained by dividing the reference frequency by the conversion gain of the oscillator.

The PLL circuit may include a frequency modulation component output unit that adds a value corresponding to a frequency modulation component to the division ratio and also outputs the value corresponding to the frequency modulation component to the data conversion unit.

According to another embodiment of the present invention, there is provided a radio terminal device which includes the PLL circuit.

According to another embodiment of the present invention, there is provided a control method of a PLL circuit, including the steps of: comparing an accumulated addition value of a division ratio converted into a digital value and that of a clock count of an oscillating signal from an oscillator controlled by using the digital value in each cycle of a reference frequency; causing output of the phase comparison step to converge to an arbitrary setting value by a data conversion unit having a variable gain amplification unit to change a gain; detecting an offset arising due to a change in gain of the variable gain amplification unit using output of the phase comparison step;

and compensating for the offset detected in the offset detection step in timing when the gain of the variable gain amplification unit changes.

According to the present invention described above, a novel and improved PLL circuit having a digitally controlled oscillator and capable of locking the frequency at high speed by compensating for an offset that arises when the loop gain is switched and an offset compensation method of the PLL circuit can be provided.

DETAILED DESCRIPTION OF THE PREFERRED EMBODIMENTS

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

Preferred embodiments of the present invention will be described in detail in the order shown below:

[1] Configuration and operation of an ADPLL circuit in related art

[2] Configuration and operation of a PLL circuit according to the first embodiment of the present invention

[3] Modification of the first embodiment of the present invention

[4] Configuration of a communication apparatus according to the second embodiment of the present invention

[1] Configuration and operation of an ADPLL circuit in related art

First, before describing preferred embodiments of the present invention in detail, the configuration and operation of a ADPLL circuit in related art intended to converge with precision by switching the loop gain will be described.

Figure 6:
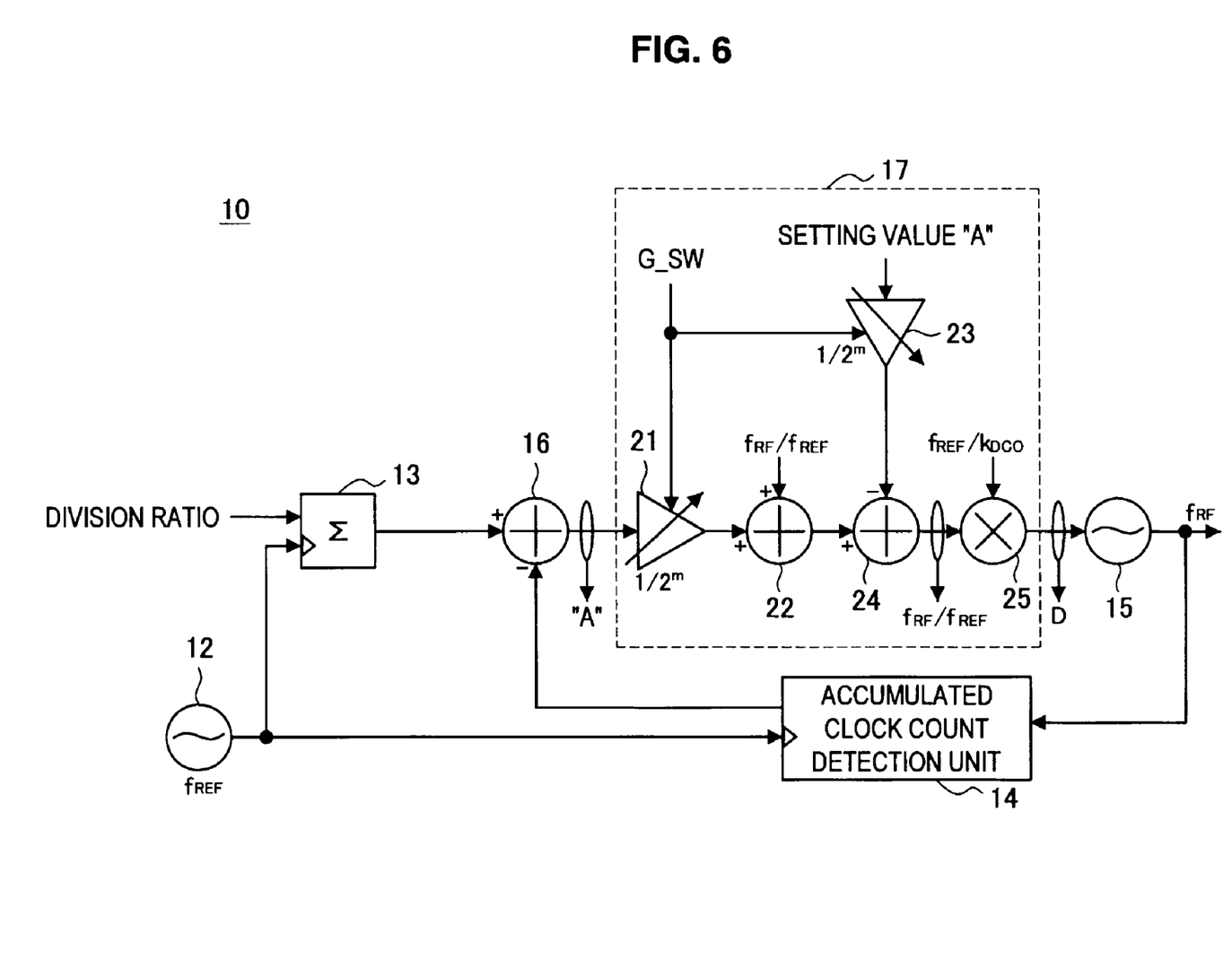
FIG. 6 is an explanatory view exemplifying a ADPLL circuit in related art.

FIG. 6 is an explanatory view exemplifying an ADPLL circuit in related art having a function to switch the loop gain. The ADPLL circuit 10 shown in FIG. 6 includes a reference frequency oscillator 12, an accumulator 13, an accumulated clock count detection unit 14, a DCO 15, a first adder 16, and a data conversion unit 17. The data conversion unit 17 includes a first variable gain amplifier circuit 21, a second adder 22, a second variable gain amplifier circuit 23, a third adder 24, and a multiplier 25. The ADPLL circuit 10 adopts a configuration in which the loop gain is switched by changing a multiplier m of the gain $½^m$ of the two variable gain amplifier circuits 21 and 23 by a control signal G_SW.

The operation of the ADPLL circuit 10 shown in FIG. 6 will briefly be described. The accumulator 13 performs cumulative addition processing of division ratio using a clock output from the reference frequency oscillator 12 as a trigger. The accumulated clock count detection unit 14 holds the accumulated addition value of the clock count output from the DCO 15 using a clock output from the reference frequency oscillator 12 as a trigger. A result of the cumulative addition processing by the accumulator 13 is sent to the first adder 16 as an accumulated addition value and an output value of the accumulated clock count detection unit 14 is subtracted.

Output of the first adder 16 is amplified $½^m$ times by the first variable gain amplifier circuit 21 and $f_{RF}/f_{REF}$ is added by the second adder 22 ($f_{RF}$ is the oscillatory frequency of DCO and $f_{REF}$ is the reference frequency). Then, a setting value A amplified $½^m$ times by the second variable gain amplifier circuit 23 is subtracted by the third adder 24 and $f_{REF}/k_{DCO}$ is multiplied by the multiplier 25 to generate control data D of the DCO 15.

Here, if the conversion gain of the DCO 15 is ideally normalized by being multiplied by $f_{REF}/k_{DCO}$ by the multiplier 25, input of the multiplier 25 converges to $f_{RF}/f_{REF}$, which is equivalent to the division ratio ($k_{DCO}$ is the conversion gain of the DCO 15). Thus, output of the first adder 16 converges to the setting value A input into the second variable gain amplifier circuit 23. If, for example, the integer part of the first adder 16 is represented as 10-bit unsigned data, the data can be caused converge to the middle point of the variable range of the first adder 16 with stability by using 512, which is the middle point, as the setting value A.

If the gain of the first variable gain amplifier circuit 21 and the second variable gain amplifier circuit 23 is switched from $½^{M1}$ to $½^{M2}$ by the control signal G_SW (M1<M2 is assumed) and if the conversion gain of the DCO 15 is ideally normalized, output of the first variable gain amplifier circuit 21 will typically be canceled by output of the second variable gain amplifier circuit 23. Therefore, input of the multiplier 25 to normalize the DCO 15 maintains convergence to the division ratio $f_{RF}/f_{REF}$ without causing discontinuities.

Figure 7A:
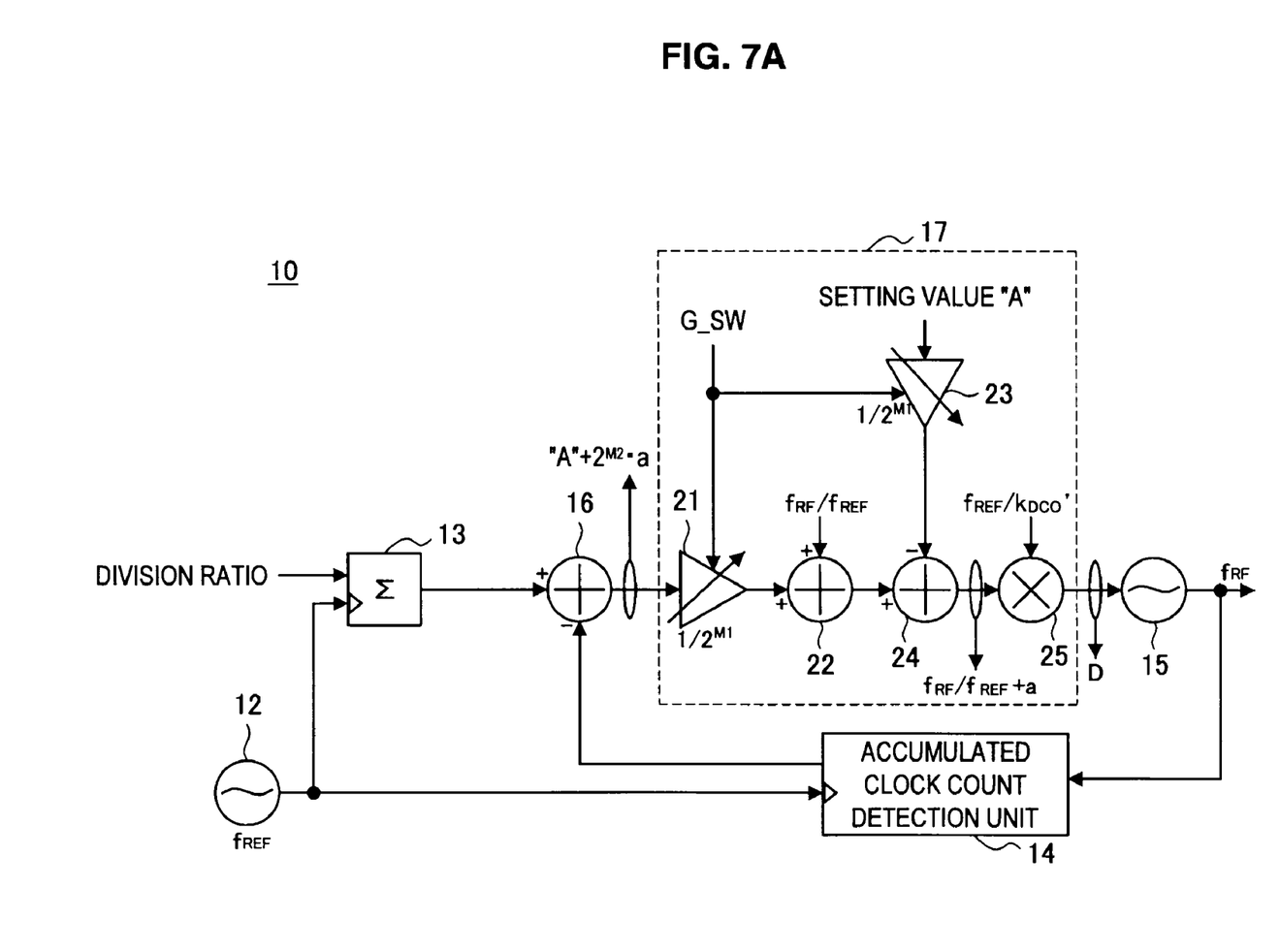
FIG. 7A is an explanatory view illustrating an example in which normalization of the DCO contains an error in an ADPLL circuit 10 shown in FIG. 6.
Figure 7B:
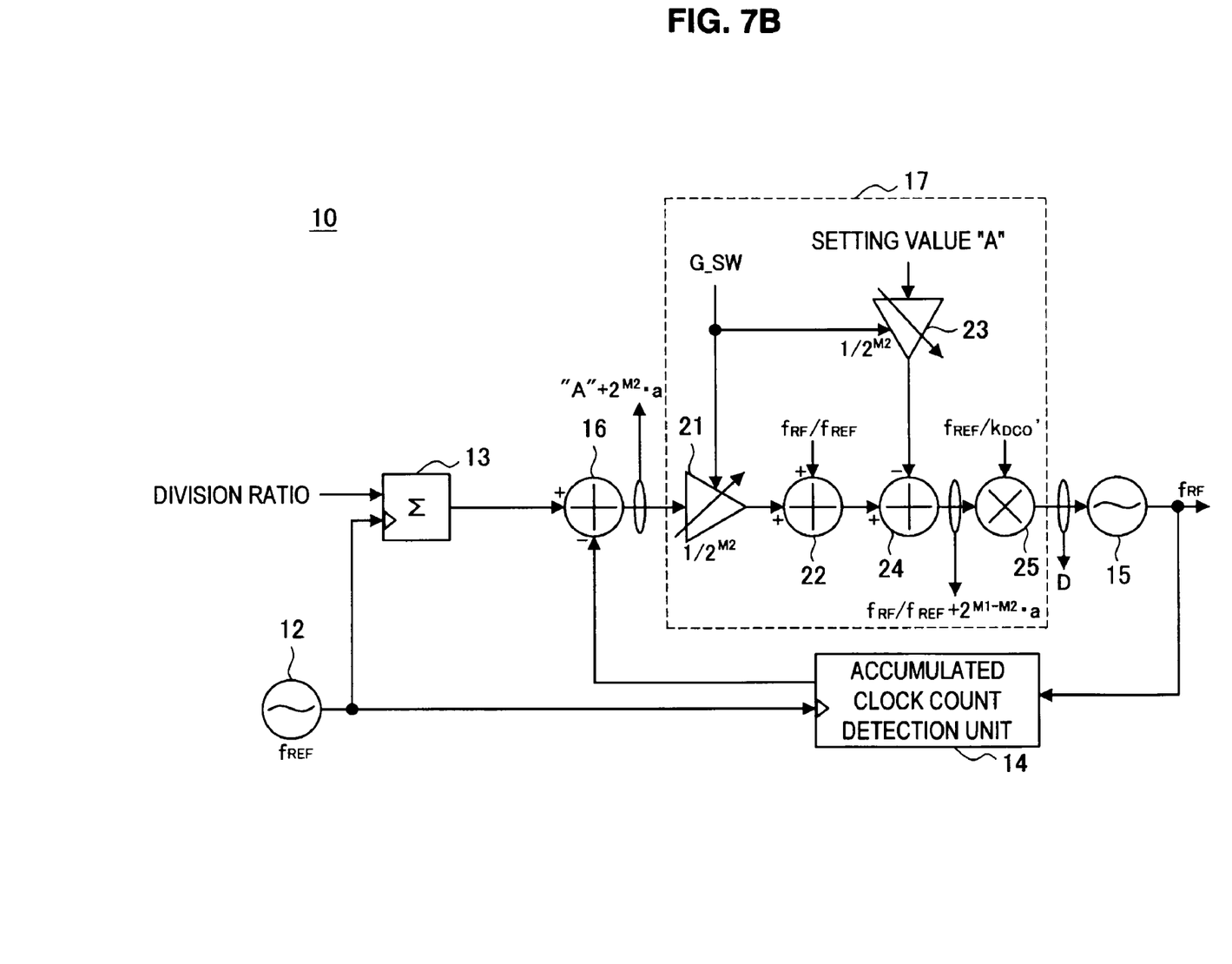
FIG. 7B is an explanatory view illustrating an example in which normalization of the DCO contains an error in an ADPLL circuit 10 shown in FIG. 6.

If, however, the conversion gain of the DCO 15 is not ideally normalized, input of the multiplier 25 may become discontinuous. FIG. 7A and FIG. 7B are explanatory views illustrating examples in which normalization of the conversion gain of the DCO 15 contains an error in the ADPLL circuit 10 shown in FIG. 6. If $k_{DCO}'$ is a value containing an error with respect to $k_{DCO}$, normalization of the conversion gain of DCO multiplied by $f_{REF}/k_{DCO}'$ also contains an error. Thus, input of the multiplier 25 will converge to a value obtained by adding an offset (the value of an offset is set as a) to the division ratio $f_{RF}/f_{REF}$.

In the example shown in FIG. 7A, the gain of the first variable gain amplifier circuit 21 and the second variable gain amplifier circuit 23 is set to $½^{M1}$ and input of the multiplier converges to $f_{RF}/f_{REF}+a$. If, as shown in FIG. 7B, the gain of the first variable gain amplifier circuit 21 and the second variable gain amplifier circuit 23 is switched to $½^{M2}$ from this state, output of the first variable gain amplifier circuit 21 changes to $A/2^{M2}+2^{M1-M2} \cdot a$ and input of the multiplier changes to $f_{RF}/f_{REF}+2^{M1-M2} \cdot a$.

The ADPLL circuit 10 shown in FIG. 7A and FIG. 7B operates in such a way that input of the multiplier 25 converges to ($f_{RF}/f_{REF}$+a) in the end. Therefore, in the ADPLL circuit 10 in related art, there is an issue that the time necessary for convergence becomes longer due to an offset portion ($2^{M1-M2}-1$)·a that arises when the gain of the first variable gain amplifier circuit 21 and the second variable gain amplifier circuit 23 is switched.

To solve the above issue, the configuration of a PLL circuit according to the first embodiment of the present invention that realizes a fast lock by compensating for an offset that arises when the loop gain is switched in the PLL circuit having a digitally controlled oscillator will be described below.

Figure 1:
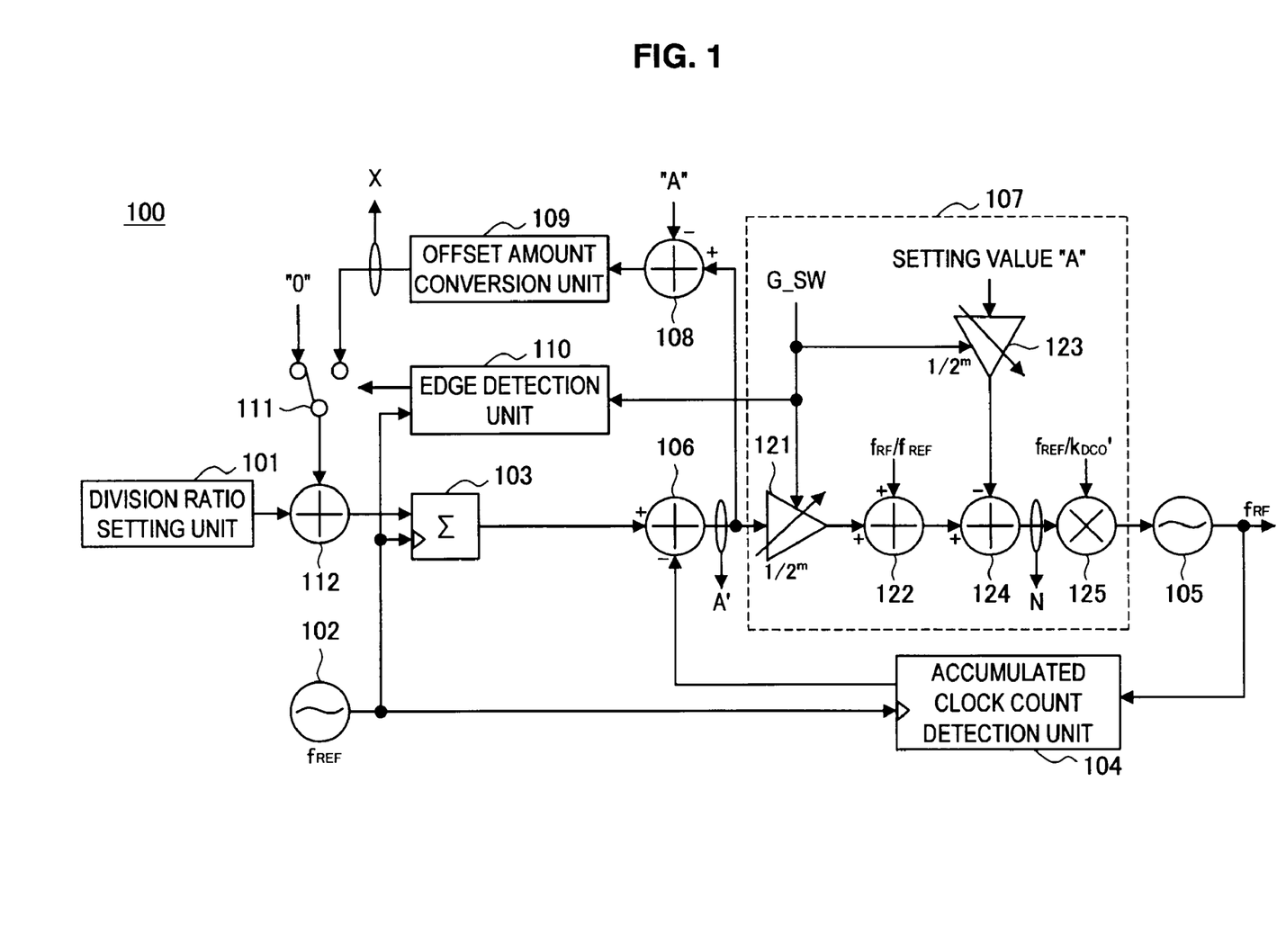
FIG. 1 is an explanatory view illustrating a configuration of a PLL circuit 100 according to a first embodiment of the present invention.

[2] Configuration and operation of a PLL circuit according to the first embodiment of the present invention First, the configuration of a PLL circuit according to the first embodiment of the present invention will be described. FIG. 1 is an explanatory view illustrating the configuration of the PLL circuit 100 according to the first embodiment of the present invention. The configuration of the PLL circuit 100 according to the first embodiment of the present invention will be described using FIG. 1.

As shown in FIG. 1, the PLL circuit 100 according to the first embodiment of the present invention includes a division ratio setting unit 101, a reference frequency oscillator 102, an accumulator 103, an accumulated clock count detection unit 104, a DCO 105, a first adder 106, a data conversion unit 107, a second adder 108, an offset amount conversion unit 109, an edge detection unit 110, a switch 111, and a third adder 112. Then, the data conversion unit 107 includes a first variable gain amplifier circuit 121, a fourth adder 122, a second variable gain amplifier circuit 123, a fifth adder 124, and a multiplier 125.

The division ratio setting unit 101 is used to set the division ratio of the PLL circuit 100. Information of the division ratio set by the division ratio setting unit 101 is sent to the accumulator 103 to be used for cumulative addition processing in the accumulator 103. The reference frequency oscillator 102 is an oscillator that oscillates at reference frequency $f_{REF}$. A clock of the reference frequency $f_{REF}$ generated by the reference frequency oscillator 102 is output to the accumulator 103, the accumulated clock count detection unit 104, and the edge detection unit 110.

The accumulator 103 performs cumulative addition processing of division ratio based on information of the division ratio sent from the division ratio setting unit 101 using a clock of the reference frequency output from the reference frequency oscillator 102 as a trigger. That is, the accumulator 103 performs addition processing at each clock. A result of the cumulative addition processing by the accumulator 103 is sent to the first adder 106 as an accumulated addition value and an output value of the accumulated clock count detection unit 104 is subtracted.

The accumulated clock count detection unit 104 is used to cumulatively add the clock count output from the DCO 105. The accumulated clock count detection unit 104 holds the accumulated addition value of the output clock count from the DCO 105 using a clock output from the reference frequency oscillator 102 as a trigger. That is, the accumulated clock count detection unit 104 holds the accumulated addition value of clock count output from the DCO 105 during one clock of the reference frequency output from the reference frequency oscillator 102. Subtraction processing of the clock count held by the accumulated clock count detection unit 104 from the accumulated addition value of the accumulator 103 is performed by the first adder 106. The accumulated clock count of output clock count of the DCO 105 can be represented in decimal representation by the accumulated clock count detection unit 104. For example, a counter circuit to detect the integer value of a clock count and a Time to Digital Converter circuit to correct the fractional part are generally used as the accumulated clock count detection unit 104, but it is needless to say that the present invention is not limited to this.

The DCO 105 is a digitally controlled oscillator and an oscillator that oscillates at oscillatory frequency $f_{RF}$. In addition to being output to the outside of the PLL circuit 100, a clock generated by the DCO 105 is sent to the accumulated clock count detection unit 104 so that, as described above, the output clock count is cumulatively added.

The first adder 106 is used to subtract the accumulated addition value of the accumulated clock count detection unit 104 output from the accumulated clock count detection unit 104 from the accumulated addition value of the accumulator 103 output from the accumulator 103 and output a subtraction result. By subtracting the accumulated addition value of the accumulated clock count detection unit 104 from the accumulated addition value of the accumulator 103, the phase of an oscillating signal of the DCO 105 and that of the reference signal can be compared so that the first adder 106 functions as an example of a phase comparison unit in the present invention. In the first adder 106, processing to subtract the accumulated clock count in decimal representation of the output clock of the DCO 105 from the accumulated addition value of the division ratio set by the division ratio setting unit 101 is performed in each cycle of the reference frequency $f_{REF}$. Output of the first adder 106 is sent to the data conversion unit 107 and also to the second adder 108.

If the PLL circuit is digitally controlled, subtraction processing in the first adder 106 is processing to subtract the accumulated addition value of clock count of the oscillatory frequency in decimal representation from that of the division ratio converted into a digital value. Therefore, the variable range is limited by the number of bits of the first adder 106. If output of the first adder 106 is represented as 10-bit unsigned data, the data can be caused converge to the middle point of the variable range of the first adder 106 with stability by using 512, which is the middle point, as the setting value A.

The data conversion unit 107 converts a result of subtraction processing by the first adder 106 to generate control data of the DCO 105. In the data conversion unit 107, in order to cause output of the multiplier 125 to converge to a value equivalent to the division ratio, a coefficient obtained by dividing the reference frequency $f_{REF}$ by the conversion gain $k_{DCO}'$ of the DCO 105 is multiplied by the multiplier 125. The configuration of each component of the data conversion unit 107 will be described below.

The first variable gain amplifier circuit 121 is an amplifier circuit capable of changing the amplification gain. The first variable gain amplifier circuit 121 has a result of subtraction processing by the first adder 106 input thereto and outputs a result after amplification by $\frac{1}{2}^m$ times (m is an integer). The amplification gain of the first variable gain amplifier circuit 121 changes by the value of m being controlled by the control signal G_SW. Output of the first variable gain amplifier circuit 121 is sent to the fourth adder 122.

The fourth adder 122 is used to add output of the first variable gain amplifier circuit 121 and the value equivalent to the division ratio ($f_{RF}/f_{REF}$) and output the addition result to cause the output of the first adder 106 to the desired setting value A. Output of the fourth adder 122 is sent to the fifth adder 124.

Like the first variable gain amplifier circuit 121, the second variable gain amplifier circuit 123 is an amplifier circuit capable of changing the amplification gain. The second variable gain amplifier circuit 123 outputs the setting value A desired to be converged to after amplification by $\frac{1}{2}^m$ times (m is an integer). The amplification gain of the second variable gain amplifier circuit 123 changes, like that of the first variable gain amplifier circuit 121, by the value of m being controlled by the control signal G_SW. Output of the second variable gain amplifier circuit 123 is sent to the fifth adder 124.

The fifth adder 124 is used to subtract output of the second variable gain amplifier circuit 123 from that of the fourth adder 122 and output a subtraction result. Output of the fifth adder 124 is sent to the multiplier 125, where the output is multiplied by a coefficient obtained by dividing the reference frequency $f_{REF}$ by the conversion gain $k_{DCO}'$ of the DCO 105.

The multiplier 125 generates control data D of the DCO 105, as described above, by multiplying the output of the fifth adder 124 by a coefficient obtained by dividing the reference frequency $f_{REF}$ by the conversion gain $k_{DCO}'$ of the DCO 105. Output of the multiplier 125 can be caused to converge to a value equivalent to the division ratio by the coefficient obtained by dividing the reference frequency $f_{REF}$ by the conversion gain $k_{DCO}'$ of the DCO 105 being multiplied by the multiplier 125.

Here, if the conversion gain $k_{DCO}'$ of the DCO 105 matches the ideal value $k_{DCO}$ of the conversion gain of the DCO 105, output of the first adder 106 perfectly matches the setting value A input into the data conversion unit 107. However, if the conversion gain $k_{DCO}'$ of the DCO 105 contains an error, a predetermined offset amount arises. Thus, if the offset amount can be detected to compensate for the offset, the time necessary for convergence to the setting value can be reduced. With the above description, each component of the data conversion unit 107 has been described.

The second adder 108 is used to subtract the desired setting value A from output of the first adder 106 and output a result thereof. Here, the value A used by the second adder 108 for subtraction is the same value as the setting value A input into the second variable gain amplifier circuit 123. Therefore, the value A used by the second adder 108 for subtraction is a known value. The offset amount can be detected by subtracting the known desired setting value A from the output of the first adder 106 in the second adder 108. Therefore, the second adder 108 functions as an example of an offset detection unit of the present invention. The offset amount detected by the second adder 108 is sent to the offset amount conversion unit 109.

The offset amount conversion unit 109 is used to output the offset amount detected by subtracting the known desired setting value A from the output of the first adder 106 in the second adder 108 after being averaged over time. The value obtained from output of the offset amount conversion unit 109 is as given by Formula (1) shown below:

[Formula (1)]

$$X = \overline{(A'-A)} \cdot (2^{M2-M1} - 1) \quad (1)$$

In the above Formula (1), A' represents output of the first adder 106 before the gain being switched and $\frac{1}{2}^{M1}$ represents the gain of the first variable gain amplifier circuit 121 and the second variable gain amplifier circuit 123 before the gain being switched. $\frac{1}{2}^{M2}$ represents the gain of the first variable gain amplifier circuit 121 and the second variable gain amplifier circuit 123 after the gain being switched. Output X of the offset amount conversion unit 109 represented by the above Formula (1) is sent to the third adder 112 via the switch 111.

The edge detection unit 110 is used to detect timing when the control signal G_SW is switched. That is, the edge detection unit 110 is used to detect that the control signal G_SW input into the first variable gain amplifier circuit 121 and the second variable gain amplifier circuit 123 is switched from a LOW state to a HIGH state. The edge detection unit 110 detects timing when the control signal G_SW is switched by using a clock output from the reference frequency oscillator 102 as a trigger.

If the edge detection unit 110 detects switching of the control signal G_SW, the edge detection unit 110 controls changeover of connection of a terminal of the switch 111 to the offset amount conversion unit 109 side. By changing the terminal of the switch 111 to connect to the offset amount conversion unit 109 side when switching of the control signal G_SW is detected, the value obtained by adding the output X of the offset amount conversion unit 109 to the division ratio set by the division ratio setting unit can be input into the accumulator 103 only when the control signal G_SW is switched. To reflect offset compensation in the accumulator 103, the edge detection unit 110 preferably outputs in such a way that the output is held for one cycle of the reference frequency.

The third adder 112 is used to perform addition processing on the division ratio set by the division ratio setting unit 101. Normally (that is, when the control signal G_SW does not change), the terminal of the switch is connected to the "0" side. Therefore, the division ratio set by the division ratio setting unit 101 is output unchanged without being added by the third adder 112. On the other hand, when the control signal G_SW is switched, as described above, the edge detection unit 110 detects switching of the control signal G_SW. If the edge detection unit 110 detects switching of the control signal G_SW, the edge detection unit 110 changes the terminal of the switch 111 to connect to the offset amount conversion unit 109 side. Therefore, when the control signal G_SW is switched, the division ratio set by the division ratio setting unit 101 is output after the output X of the offset amount conversion unit 109 being added by the third adder 112. Therefore, the third adder 112 functions as an example of an offset compensation unit of the present invention.

Therefore, only in timing when the control signal G_SW is switched, a value obtained by adding the output X of the offset amount conversion unit 109 to the division ratio set by the division ratio setting unit 101 is input into the accumulator 103. By operating the PLL circuit 100 in this manner, the PLL circuit 100 according to the first embodiment of the present invention can compensate for an offset that results from a normalization error of the conversion gain of a digitally controlled oscillator and arises during loop gain switching.

In the foregoing, the configuration of the PLL circuit 100 according to the first embodiment of the present invention has been described. It is important for the data conversion unit 107 shown in FIG. 1 that if the conversion gain $k_{DCO}'$ of the DCO 105 is the ideal value ($k_{DCO}$), input of the multiplier 125 converges to a value equivalent to the division ratio and output of the first adder 106 converges to the setting value A. Therefore, it is needless to say in the present invention that if the above requirements are satisfied, the configuration of the data conversion unit is not limited to that in the present embodiment.

Figure 2A:
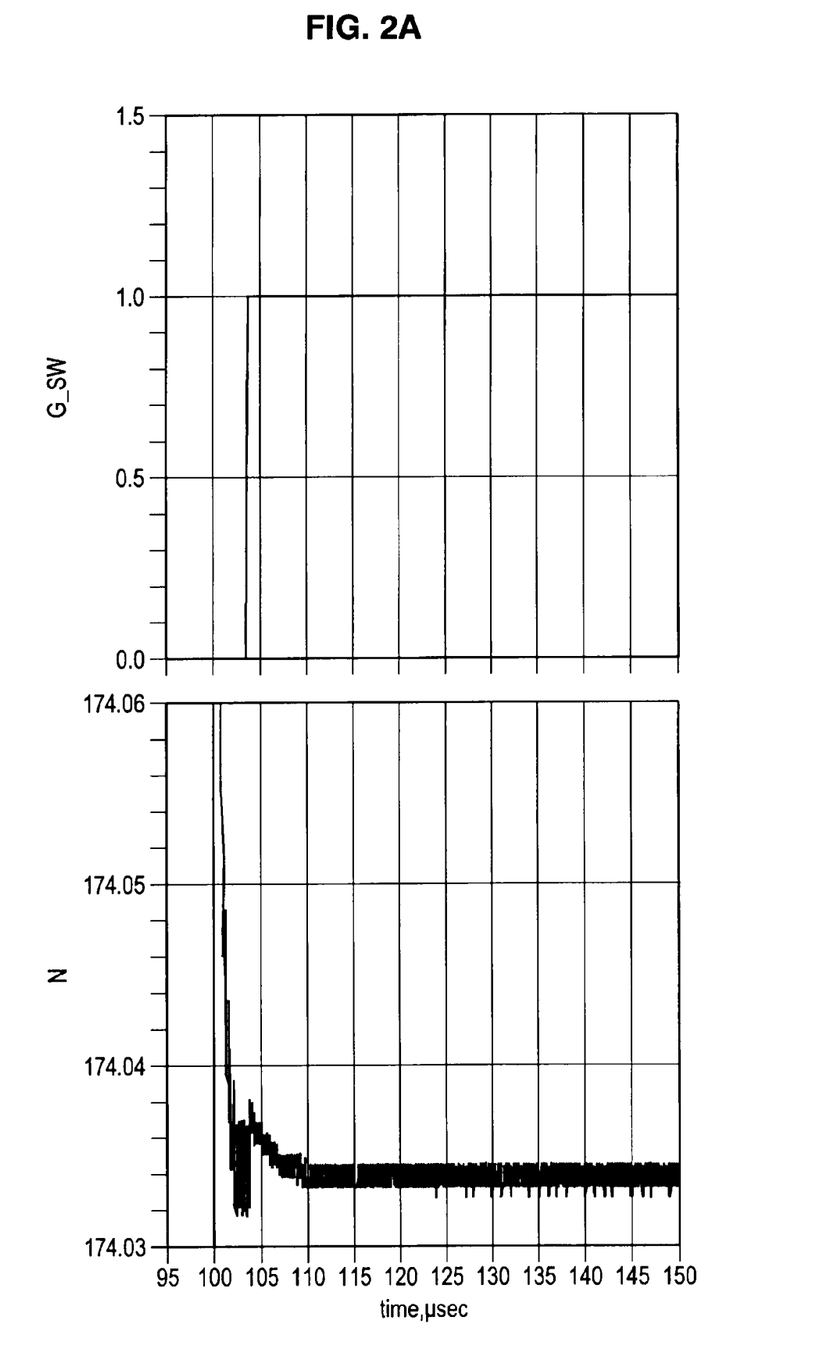
FIG. 2A is an explanatory view showing convergence properties of an ADPLL circuit in related art as graphs.

Next, a difference between convergence properties of a ADPLL circuit in related art and those of the PLL circuit 100 according to the first embodiment of the present invention will be described using graphs. FIG. 2A is an explanatory view showing convergence properties of the ADPLL circuit in related art shown in FIG. 6 as graphs and FIG. 2B is an explanatory view showing convergence properties of the PLL circuit 100 shown in FIG. 1 as graphs.

Figure 2B:
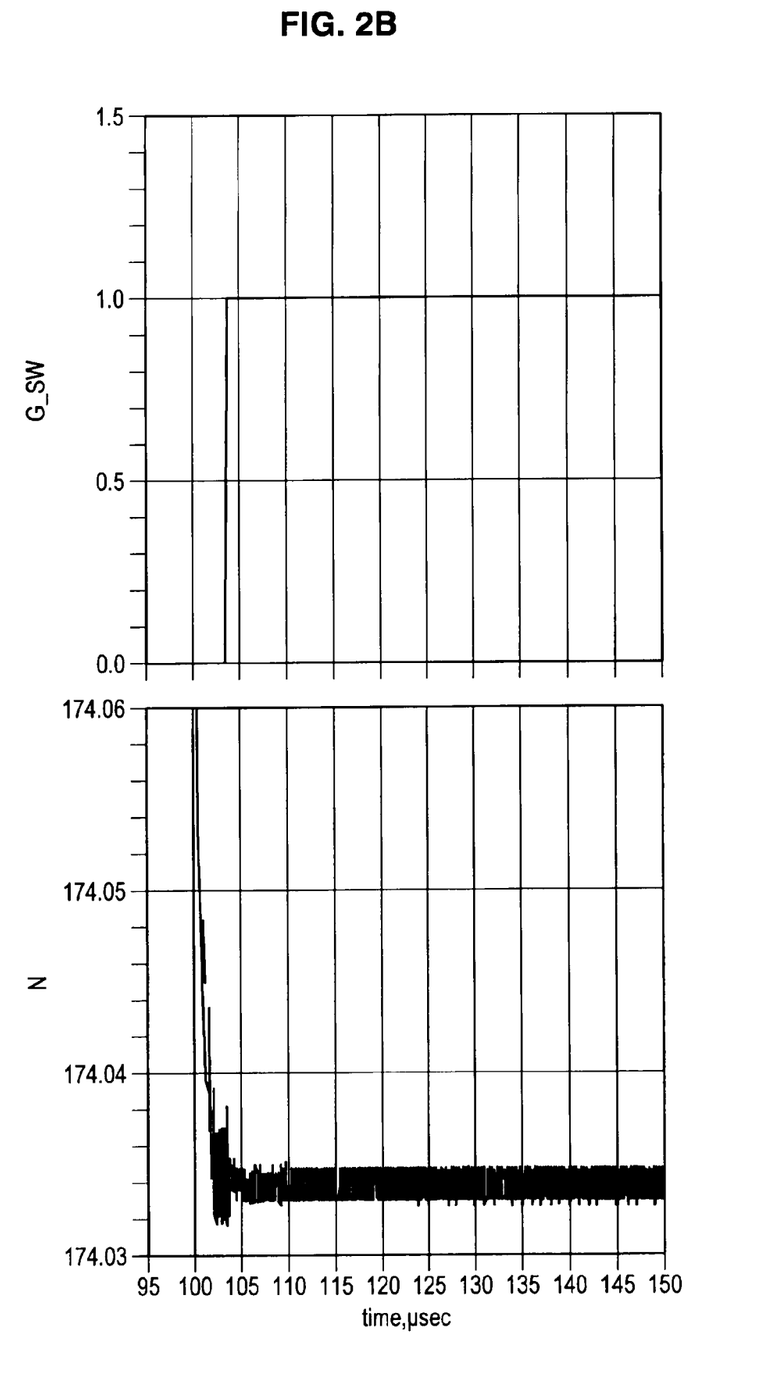
FIG. 2B is an explanatory view showing convergence properties of the PLL circuit 100 shown in FIG. 1 as graphs.

In graphs shown in FIG. 2A and FIG. 2B, the upper graph shows switching of the control signal G_SW and the lower graph shows how output of the adder 24 in FIG. 2A or output N of the fifth adder 124 in FIG. 2B converges.

Comparison of FIG. 2A and FIG. 2B shows that when compared with the ADPLL circuit in related art, the time necessary for the PLL circuit 100 before the output N of the fifth adder 124 converges is reduced by about 5 μs. In the past, delay of convergence of about 5 μs caused no issue. However, with increasing bands of frequency to be used, the demand to operate circuits faster grows so that the delay of convergence that caused no issue in the past is now hardly ignorable.

Therefore, the PLL circuit 100 according to the first embodiment of the present invention can realize high-speed locking by reducing, when compared with the ADPLL circuit in related art, the time necessary for the output N of the fifth adder 124 to converge. Moreover, the first variable gain amplifier circuit 121 operates in such a way that a phase error resulting from a digital specific quantization error appearing in output of the first adder 106 is attenuated, contributing to the reduction of phase noise. Therefore, the PLL circuit 100 according to the first embodiment of the present invention can improve the lockup time and reduce phase noise.

[3] Modification of the first embodiment of the present invention

Figure 3:
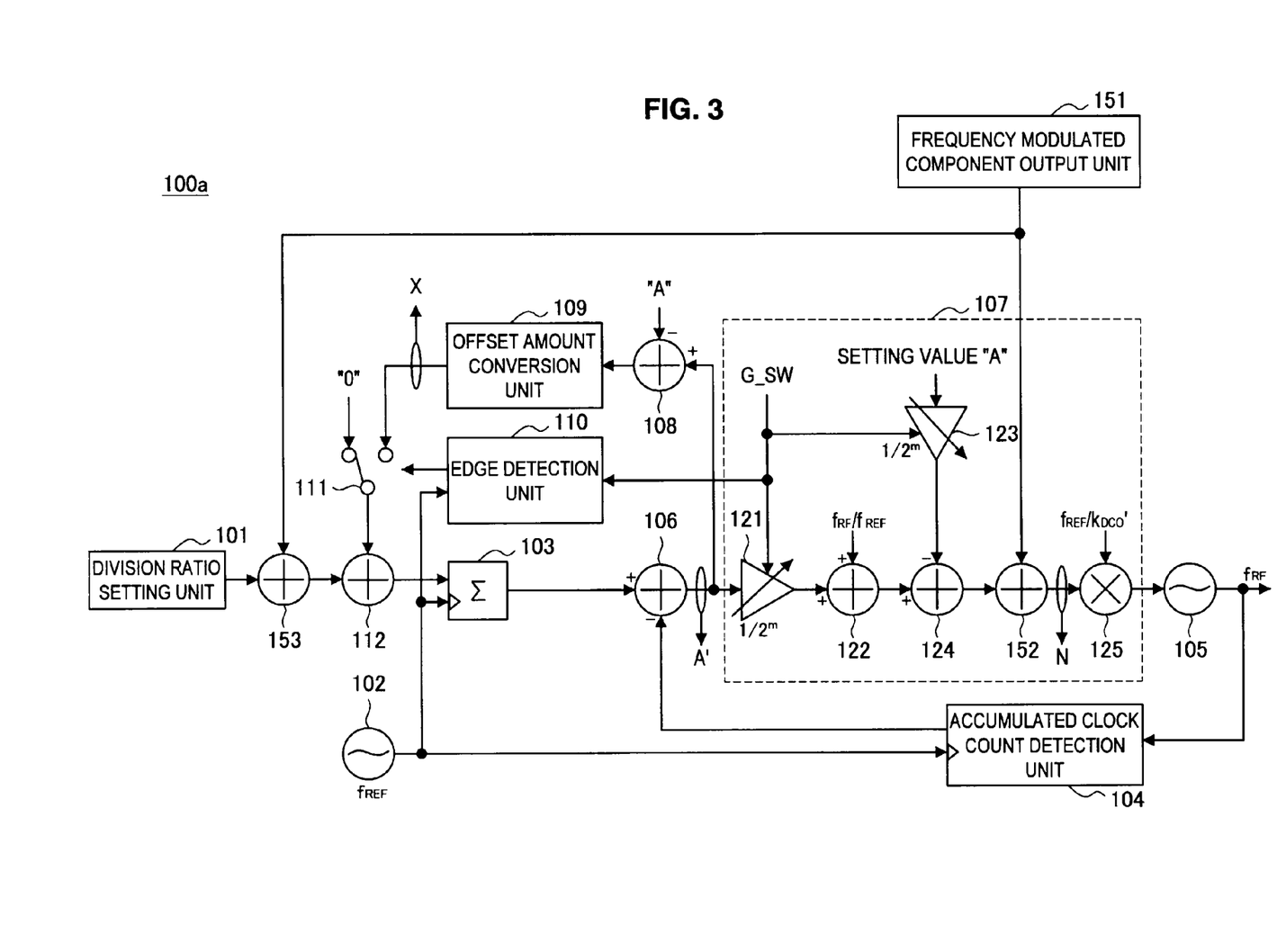
FIG. 3 is an explanatory view illustrating the configuration of a PLL circuit 100a according to a modification of the first embodiment of the present invention.

Next, a modification of the first embodiment of the present invention will be described. FIG. 3 is an explanatory view illustrating the configuration of the PLL circuit 100a according to a modification of the first embodiment of the present invention. The configuration of the PLL circuit 100a according to a modification of the first embodiment of the present invention will be described below using FIG. 3.

When compared with the PLL circuit 100 shown in FIG. 1, the PLL circuit 100a shown in FIG. 3 has a frequency modulation component output unit 151, a sixth adder 152, and a seventh adder 153 added thereto to perform direct frequency modulation on the DCO 105. Components added to FIG. 3 when compared with the PLL circuit 100 shown in FIG. 1 will be described below.

The frequency modulation component output unit 151 is used to input a frequency modulation component to perform direct frequency modulation on the DCO 105. A frequency modulation component output from the frequency modulation component output unit 151 is sent to the sixth adder 152, where the frequency modulation component and output of the fifth adder 124 are added.

The sixth adder 152 is used to add output of the fifth adder 124 and a frequency modulation component output from the frequency modulation component output unit 151. An addition result of the sixth adder 152 is output to the DCO 105.

The seventh adder 153 is used to add the division ratio output from the division ratio setting unit 101 and a frequency modulation component output from the frequency modulation component output unit 151 and output an addition result. By adding the division ratio and a frequency modulation component for output in the seventh adder 153, a modulation wave component detected by the accumulated clock count detection unit 104 can be canceled.

In the foregoing, added components in FIG. 3 have been described. Thus, a PLL circuit that performs direct frequency modulation on a DCO can also realize high-speed locking by reducing discontinuities resulting from an offset that arises when the gain of the first variable gain amplifier circuit 121 and the second variable gain amplifier circuit 123 is switched.

Figure 4:
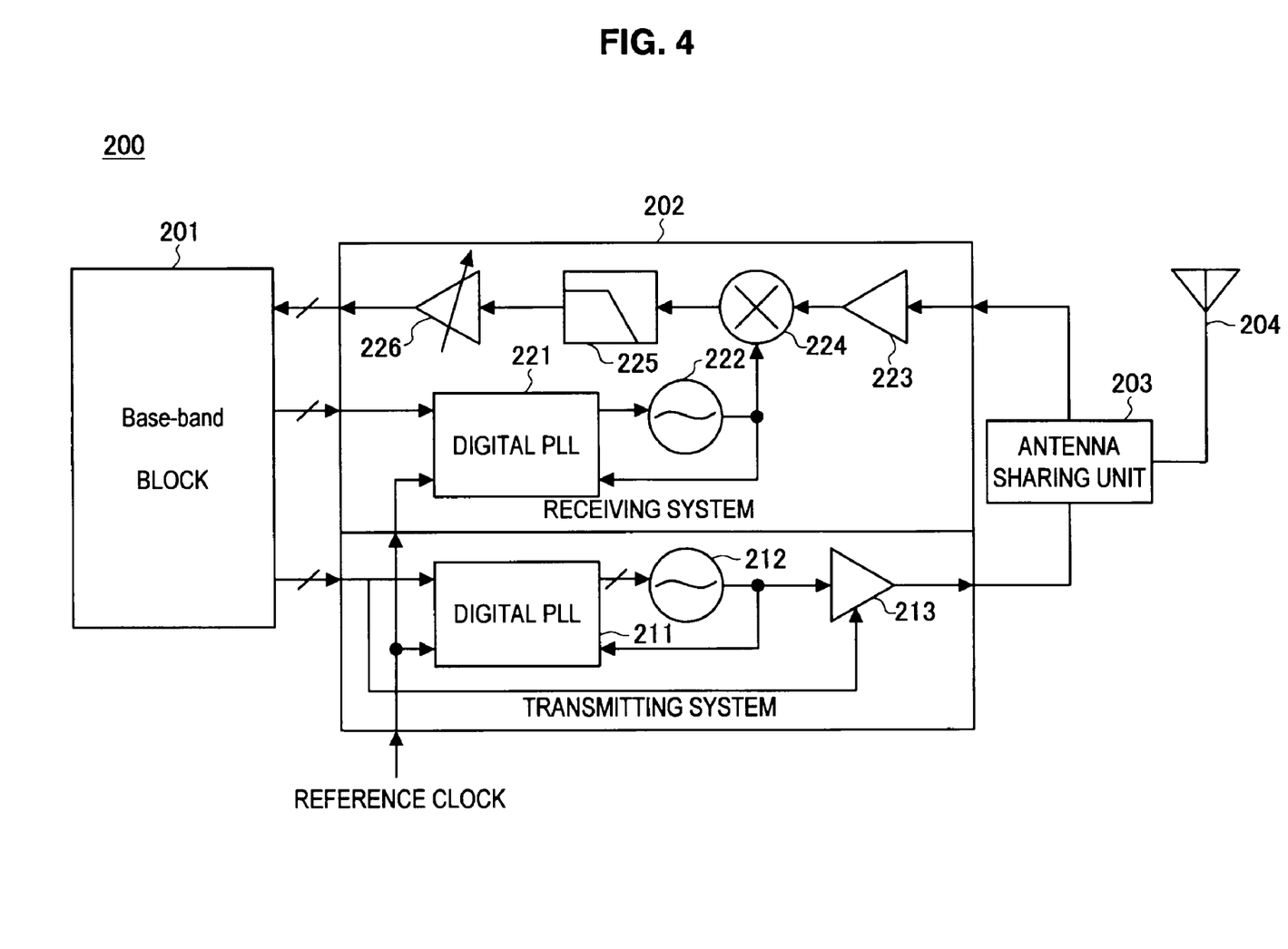
FIG. 4 is an explanatory view illustrating the configuration of a radio terminal device 200 according to a second embodiment of the present invention.

[4] Configuration of a communication apparatus according to the second embodiment of the present invention FIG. 4 is an explanatory view illustrating the configuration of the radio terminal device 200 according to the second embodiment of the present invention. The configuration of the radio terminal device 200 according to the second embodiment of the present invention will be described below using FIG. 4.

As shown in FIG. 4, the radio terminal device 200 according to the second embodiment of the present invention includes a base-band circuit (Base-band BLOCK) 201, a transmitting/receiving module 202, an antenna shared unit 203, and an antenna 204 that transmits and receives radio waves.

The base-band circuit 201 is a circuit that handles a base-band signal and delivers/receives a signal to/from the transmitting/receiving module 202. The transmitting/receiving module 202 delivers/receives a signal to/from the base-band circuit 201 to perform signal processing. The antenna shared unit 203 delivers/receives a signal to/from the transmitting/receiving module 202. The antenna 204 transmits/receives radio waves.

The transmitting/receiving module 202 can be divided into a transmission system and a reception system. The transmission system includes a digital PLL 211, an oscillator 212, and an amplifier 613, and the reception system includes a digital PLL 221, an oscillator 222, an amplifier 223, a down converter 224, a low-pass filter 225, and a variable gain converter 226.

Here, one of the PLL circuits 100 and 100a according to the first embodiment of the present invention shown, for example, in FIG. 1 or FIG. 3, can be applied to the digital PLLs 211 and 221 shown in FIG. 4. By applying one of the PLL circuits 100 and 100a to the radio terminal device 200, the radio terminal device 200 can achieve effects of each embodiment described above. That is, the radio terminal device 200 according to the second embodiment of the present invention can realize high-speed locking by reducing discontinuities resulting from an offset that arises when the gain of variable gain amplifier circuits is switched.

The configuration of the radio terminal device 200 shown in FIG. 4 is only an example and it is needless to say that the second embodiment is not limited to such an example. A PLL circuit according to the present invention can be applied to any apparatus using a digital PLL and as such a PLL circuit, for example, one of the PLL circuits 100 and 100a according to the first embodiment of the present invention described above can be applied.

The present application contains subject matter related to that disclosed in Japanese Priority Patent Application JP 2008-191491 filed in the Japan Patent Office on Jul. 24, 2008, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A PLL circuit, comprising:
   a phase comparison unit that compares an accumulated addition value of a division ratio converted into a digital value and that of a clock count of an oscillating signal from an oscillator controlled by using the digital value in each cycle of a reference frequency;
   a data conversion unit that has a variable gain amplification unit to change a gain and causes output of the phase comparison unit to converge to an arbitrary setting value;

an offset detection unit that detects an offset arising due to a change in gain of the variable gain amplification unit using output of the phase comparison unit; and an offset compensation unit that compensates for the offset detected by the offset detection unit in timing when the gain of the variable gain amplification unit changes, wherein the data conversion unit, comprising:

a first variable gain amplification unit that amplifies the output of the phase comparison unit;

an addition unit that adds the division ratio to the output of the first variable gain amplification unit;

a second variable gain amplification unit that has the same gain as that of the first variable gain amplification unit and amplifies the setting value;

a subtraction unit that subtracts the output of the second variable gain amplification unit from that of the addition unit; and a multiplication unit that multiplies the output of the subtraction unit by a value obtained by dividing the reference frequency by the conversion gain of the oscillator.

2. A PLL circuit, comprising:

a phase comparison unit that compares an accumulated addition value of a division ratio converted into a digital value and that of a clock count of an oscillating signal from an oscillator controlled by using the digital value in each cycle of a reference frequency;

a data conversion unit that has a variable gain amplification unit to change a gain and causes output of the phase comparison unit to converge to an arbitrary setting value;

an offset detection unit that detects an offset arising due to a change in gain of the variable gain amplification unit using output of the phase comparison unit;

an offset compensation unit that compensates for the offset detected by the offset detection unit in timing when the gain of the variable gain amplification unit changes;

a frequency modulation component output unit that adds a value corresponding to a frequency modulation component to the division ratio and also outputs the value corresponding to the frequency modulation component to the data conversion unit.

3. A control method of a PLL circuit, comprising the steps of:

comparing an accumulated addition value of a division ratio converted into a digital value and that of a clock count of an oscillating signal from an oscillator controlled by using the digital value in each cycle of a reference frequency;

causing output of the phase comparison step to converge to an arbitrary setting value by a data conversion unit having a variable gain amplification unit to change a gain;

detecting an offset arising due to a change in gain of the variable gain amplification unit using output of the phase comparison step; and compensating for the offset detected in the offset detection step in timing when the gain of the variable gain amplification unit changes, amplifying the output from the phase comparison step with a first variable gain amplification unit;

adding the division ratio to the output of the first variable gain amplification unit;

amplifying a setting value with a second variable gain amplification unit that has a same gain as that of the first variable gain amplification unit;

subtracting the output from the second variable gain amplification unit from that of the addition unit; and multiplying the output of the subtraction unit by a value obtained by dividing the frequency reference by the conversion gain of the oscillator.

4. A control method of a PLL circuit, comprising the steps of:

comparing an accumulated addition value of a division ratio converted into a digital value and that of a clock count of an oscillating signal from an oscillator controlled by using the digital value in each cycle of a reference frequency;

causing output of the phase comparison step to converge to an arbitrary setting value by a data conversion unit having a variable gain amplification unit to change a gain;

detecting an offset arising due to a change in gain of the variable gain amplification unit using output of the phase comparison step; and compensating for the offset detected in the offset detection step in timing when the gain of the variable gain amplification unit changes, adding a value corresponding to a frequency modulation component to the division ratio; and outputting the value corresponding to the frequency modulation component to the data conversion unit.

* * * * *